United States Patent [19]

Allen et al.

[11] Patent Number: 4,601,915
[45] Date of Patent: Jul. 22, 1986

[54] METHOD OF FABRICATING AIR SUPPORTED CROSSOVERS

[75] Inventors: Donald E. Allen, Gilbert; Richard A. Gross; Howard D. Knuth, both of Tempe, all of Ariz.

[73] Assignee: Motorola, Inc., Schaumburg, Ill.

[21] Appl. No.: 653,414

[22] Filed: Sep. 24, 1984

[51] Int. Cl.$^4$ ............................................. H01L 21/88
[52] U.S. Cl. .................................... 427/96; 430/315; 430/329
[58] Field of Search ............................. 427/96, 89, 90; 430/315, 329, 314; 204/38.1, 38.7

[56] References Cited

U.S. PATENT DOCUMENTS 4,054,484 10/1977 Lesh et al. ........................... 156/652
4,436,766 3/1984 Williams .............................. 427/96

Primary Examiner—John D. Smith
Assistant Examiner—K. Jaconetty
Attorney, Agent, or Firm—Raymond J. Warren

[57] ABSTRACT

A method is disclosed for the fabrication of an air supported crossover bridge which consists of a polyimide coating being set over the metalized device. Then, supports are defined for the crossover and the crossover is added. Once the crossover has been added the excess is removed and the polyimide layer is removed leaving the air supported bridge.

9 Claims, 8 Drawing Figures

METHOD OF FABRICATING AIR SUPPORTED CROSSOVERS

BACKGROUND OF THE INVENTION

1. Field of the Invention

This invention relates, in general, to a method of fabricating crossovers and, more particularly, to a method of fabricating air supported crossovers for multi-phase surface acoustic wave transducers, Lange microwave couplers, high density multi-track integrated circuits, or the like.

2. Description of the Background

While methods of prdducing air supported crossovers are known in the art the existing processes have low reliability and a corresponding low yield. This low reliability is caused from shorts that exist between the crossover and the conductors that are to be crossed. When this occurs the short must be located and removed, taking a great deal of time and expense.

SUMMARY OF THE INVENTION

Accordingly, it is an object of the present invention to provide a method of fabrictating air supported crossovers that have increased reliability.

A further object of the present invention is to provide a method of fabricating air supported crossovers having a higher yield.

Still another object of the present invention is to provide a method of fabricating air supported crossovers more economically.

Yet another object of the present invention is to provide a method of fabricating an air supported crossover that is strong, reliable and affords low capacitance to spanned conductive tracts.

The above and other objects and advantages of the present invention are provided by a method of fabricating air supported crossovers.

A particular embodiment of the present invention uses a process of laying a polyimide coating over the metalized device. Then, supports are defined for the crossover and the crossover is added. Once the crossover has been added the excess material and the polyimide layer are removed leaving the air supported bridge.

DETAILED DESCRIPTION OF THE DRAWINGS

Referring now to FIGS. 1-7 the cross sections of a fabrication process embodying the present invention are illustrated. The process of fabricating the air supported crossovers will be described here for acoustic wave devices though it should be noted that this process may be used in other various devices. The fabrication process consists of the following steps. First, a substrate, such as a piezoelectric crystal (e.g. Lithium Niobate, $LiNbO_3$), is cleaned and rinsed with deionized water. The deionized water is used to remove possible contaminates. Second, a blanket coat of aluminum is deposited on the crystal by evaporation. Third, a photoresist is patterned over the aluminum having the pattern of the transducer fingers. This pattern is also referred to as a mask. Fourth, the aluminum is etched from the piezoelectric crystal everywhere except where the photoresist has covered the aluminum. Next, the device is cleaned and stripped of the photoresist leaving the device indicated in FIG. 1, where transducer fingers 11 are shown on a crystal 10.

Figure 1:
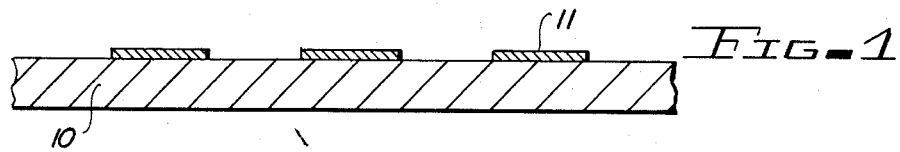
FIGS. 1-7 illustrates cross sections of a fabrication process embodying the present invention.
Figure 2:
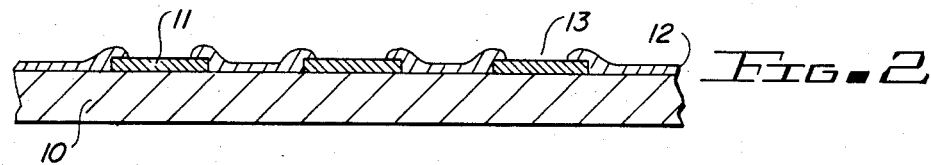

Following the metalization process above, a polyimide application is spun on covering the device approximately one micron in depth. A spin process is used to get an even distribution over the entire surface. The polyimide is then partially cured in a low temperature environment. Next, a photoresist pattern is set down to define vias over the transducers that are to be connected. The polyimide is then chemically etched away to remove the polyimide only from the vias where the crossovers will be making contact with the aluminum. The photoresist is then removed. This process of masking, etching or coating, and removing the mask is often referred to as delineating a pattern. The polyimide is finally cured at a higher temperature. This is illustrated in FIG. 2, where a polyimide 12 covers the device of FIG. 1, defining a via 13.

Figure 3:
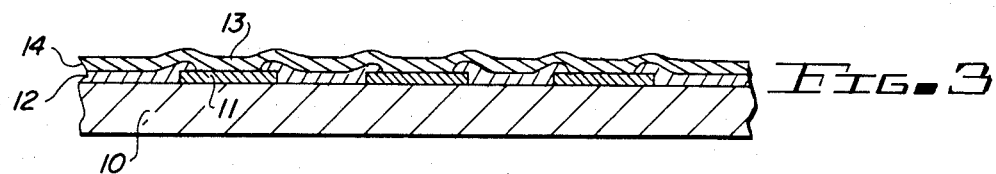

Next, a layer of Chrome, approximately 500 Angstroms thick is put down. Covering the Chrome is a layer of Nickel, having a depth of approximately 1000 Angstroms, and covering the Nickel is a layer of Gold, having a depth of approximately 1000 Angstroms. The Chrome layer is required to provide a means to bind to Aluminum. The Nickel is required to provide a buffer between the Gold and Chrome and to provide something the Gold will adhere to. This is illustrated in FIG. 3 where FIG. 2 is shown coated with a Chrome/Nickel/Gold layer 14.

Figure 4:
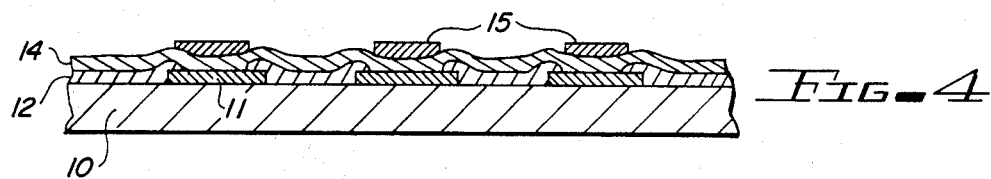

Following the above step, a photoresist plating mask is placed over via 13 to prevent plating of the vias. This is shown in FIG. 4, where photoresist 15 is added to the device shown in FIG. 3.

Figure 5:
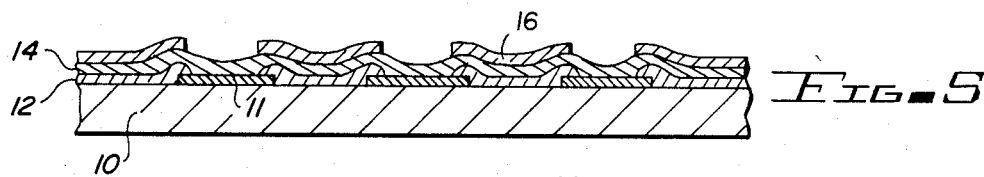

Next, the device is electroplated, covering all but the photoresist, with a Copper plate approximately ¼ mil thick. This Copper plate will be used as a support structure for the crossover. The photoresist is then removed leaving an opening to the Chrome/Nickel/Gold layer. This is illustrated in FIG. 5, where a layer of Copper 16 has been added to FIG. 4.

Figure 6:
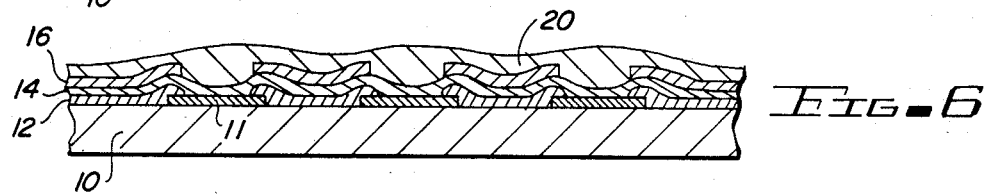
Figure 7:
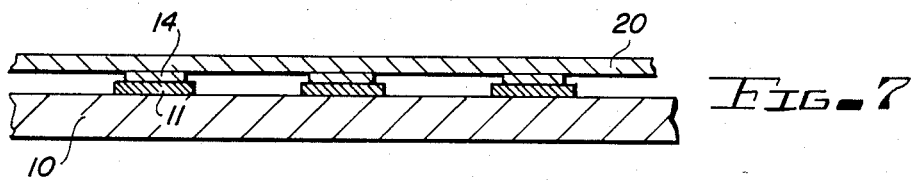

The area where the crossover is to be located is next defined by another layer of photoresist placed on the Copper. A layer of Gold approximately ¼ mil thick is then electroplated over the Copper in the area defined by the photoresist. The photoresist is then removed leaving a Gold bridge, 20, as illustrated in FIG. 6.

Finally, the excess material is removed as detailed below. The Copper is etched away creating an air gap under the Gold crossover. Then the thin film of Gold, approximately 1000 Angstroms thick, is etched away from the surface. This etching of the Gold layer will also remove a small portion of the Gold crossover, however, most of the crossover will be left. The Nickel and Chrome layers are then chemically etched away. The Nickel, Chrome and Gold that form the supports are left substantially intact during this etching process. During this time the polyimide coating has remained over the aluminum fingers protecting them. This polyimide coating is then removed through a plasma etching giving the final result shown in FIG. 7. Fabricating a crossover in this fashion prevents shorts resulting in increased reliability and higher yield.

Figure 8:
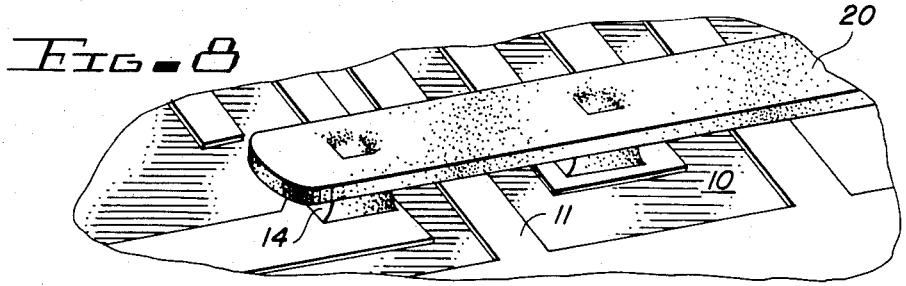
FIG. 8 is a perspective view of a crossover produced utilizing a process embodying the present invention.

Referring now to FIG. 8 a perspective view of a crossover produced utilizing a fabrication method embodying the present invention is illustrated. A crystal 10 is shown having aluminum transducers 11 disposed thereon. A Gold bridge, 20, is shown being supported by pedestals 14 made of Chrome, Nickel, and Gold.

Thus, it is apparent that there has been provided in accordance with the invention, a method that fully satisfies the objects, aims and advantages set forth above.

It has been shown that the present invention provides a method that will provide increased reliability and higher yield through protecting the transducers with the polyimide coating; and through having layers set down that prevents the Gold crossover from shorting against a transducer.

While the invention has been described in conjunction with specific embodiments thereof, it is evident that many alterations, modifications and variations will be apparent to those skilled in the art in light of the foregoing description. Accordingly, it is intended to embrace all such alternatives, modifications and variations in the appended claims.

We claim:

1. A method of fabricating an air supported crossover device comprising the steps of:
   providing a substrate;
   cleaning said substrate;
   depositing aluminum on said substrate;
   masking said aluminum with a first photoresist defining a conductor;
   removing said aluminum about said first photoresist
   removing said first photoresist providing a metalized substrate;
   coating said metalized substrate with a polyimide;
   curing said polyimide partially;
   delineating a via pattern on said polyimide;
   curing said polimide totally;
   coating said polyimide coated metalized substrate with a metal layer;
   delineating a support pattern on said metal layer;
   delineating a crossover pattern on the support pattern; and
   removing an excess of said metal layer, leaving said crossover and support.

2. The method of claim 1 wherein said steps of delineating a via of said polyimide coat comprises the steps of:
   masking a pattern defining said via with a second photoresist;
   removing said polyimide from said via; and
   removing said second photoresist.

3. The method of claim 1 wherein said step of coating said polyimide coated metalized substrate with a metal layer comprises the steps of:
   depositing a layer of chrome on said polyimide coated metalized substrate;
   depositing a layer of nickel on said chrome layer; and
   depositing a layer of gold on said nickel layer.

4. The method of claim 3 wherein said step of delineating said support pattern on said metal layer comprises the steps of:
   masking a pattern defining said support with a third photoresist;
   plating a layer of copper on said device; and
   removing said third photoresist thereby exposing a portion of said metal layer which will become said support.

5. The method of claim 4 wherein said step of delineating a crossover pattern on the support pattern comprises the steps of:
   masking a pattern defining a crossover with a fourth photoresist;
   plating said crossover with gold; and
   removing said fourth photoresist.

6. The method of claim 5 wherein said step of removing said excess of said metal layer comprises the steps of;
   removing said copper leaving an air gap below a portion of said crossover;
   removing a portion of said gold layer, leaving said gold crossover and a gold portion of said support;
   removing a potion of said nickel layer, leaving a nickel portion of said support;
   removing a portion of said chrome layer, leaving a chrome portion of said support; and
   removing said polyimide.

7. The method of claim 1 wherein said step of coating said device with a polyimide is accomplished through a spin application to obtain an even flow over said device.

8. A method of fabricating an air supported crossover device comprising the steps of:
   providing a substrate definfing a base of said device;
   cleaning said substrate;
   depositing aluminum on said substrate;
   masking said aluminum with a first photoresist defining aconductor;
   removing said aluminum about said first photoresist;
   removing said first photoresist;
   coating the conductor and substrate with a polyimide;
   curing said polimide partially;
   masking a pattern defining a via with a second photoresist;
   removing said polyimide from said via;
   removing said second photoresist;
   curing said polyimide totally;
   depositing a layer of chrome on said polyimide layer;
   depositing a layer of nickel on said chrome layer;
   depositing a layer of gold on said nickel layer;
   masking a pattern defining a support with a third photoresist said support being comprised of portions of said chrome, nickel and gold layers;
   plating a layer of copper on said third photoresist;
   removing said third photoresist;
   masking a pattern defining a crossover with a fourth photoresist;
   plating said crossover area with gold;
   removing said fourth photoresist;
   removing said copper leaving an air gap below a portion of said crossover;
   removing a portion of said gold layer, leaving said gold crossover and said gold portion of said support;
   removing a portion of said nickel layer, leaving said nickel portion of said support;
   removing a portion of said chrome, leaving said chrome portion of said support; and
   removing said polyimide.

9. The method of claim 8 wherein said step of coating said device with a polyimide is accomplished through a spin application to obtain an even flow over said device.

* * * * *